(12) United States Patent
Xu et al.

(10) Patent No.: US 11,163,185 B2
(45) Date of Patent: Nov. 2, 2021

(54) DISPLAY DEVICE

(71) Applicant: Wuhan China Star Optoelectronics Semiconductor Display Technology Co., Ltd., Hubei (CN)

(72) Inventors: Bin Xu, Hubei (CN); Hongyu Xu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 146 days.

(21) Appl. No.: 16/462,932

(22) PCT Filed: Feb. 19, 2019

(86) PCT No.: PCT/CN2019/075427
§ 371 (c)(1),
(2) Date: May 21, 2019

(87) PCT Pub. No.: WO2020/087803
PCT Pub. Date: May 7, 2020

(65) Prior Publication Data
US 2020/0409203 A1 Dec. 31, 2020

(30) Foreign Application Priority Data
Oct. 31, 2018 (CN) .......................... 201811285330.4

(51) Int. Cl.
*G02F 1/1333* (2006.01)
*G02F 1/1345* (2006.01)
(Continued)

(52) U.S. Cl.
CPC .... *G02F 1/133308* (2013.01); *G02F 1/13452* (2013.01); *H05K 1/189* (2013.01); *G09F 9/301* (2013.01); *H05K 2201/10128* (2013.01)

(58) Field of Classification Search
CPC .......... G02F 1/133308; G02F 1/13452; H05K 1/189; H05K 2201/10112; H01L 27/3225
See application file for complete search history.

(56) References Cited

U.S. PATENT DOCUMENTS 10,051,738 B2 * 8/2018 Park ........................ H05K 1/118
10,595,408 B2 * 3/2020 Lim ........................ H05K 1/028
(Continued)

FOREIGN PATENT DOCUMENTS

| CN | 101216618 A | 7/2008 |
| CN | 104111554 A | 10/2014 |

(Continued)

*Primary Examiner* — Kevin M Nguyen
(74) *Attorney, Agent, or Firm* — Hamre, Schumann, Mueller & Larson, P.C.

(57) ABSTRACT

A display device, including: a display panel, the display panel including a display region and a binding region disposed outside the display region; a flexible circuit board comprising a main body portion and a connecting portion disposed on one side of the main body portion, the connecting portion being disposed on the binding region; wherein, the connecting portion includes a first end, and at least one second end connected to the first end and extending in a direction from the first end to the display region.

15 Claims, 4 Drawing Sheets

(51) Int. Cl.
    *G09F 9/30*     (2006.01)
    *H05K 1/18*     (2006.01)

(56) References Cited

U.S. PATENT DOCUMENTS

| | | |
|---|---|---|
| 2008/0165316 A1 | 7/2008 | Hasegawa et al. |
| 2011/0227848 A1 | 9/2011 | Furusawa |
| 2014/0313439 A1 | 10/2014 | Matsumoto |
| 2015/0163939 A1 | 6/2015 | Park |
| 2017/0168463 A1* | 6/2017 | Hong .................... G04G 9/0064 |
| 2018/0069067 A1 | 3/2018 | Oh et al. |
| 2018/0196300 A1 | 7/2018 | Jung et al. |
| 2019/0074332 A1* | 3/2019 | Kim ....................... G01B 7/287 |

FOREIGN PATENT DOCUMENTS

| | | |
|---|---|---|
| CN | 107799050 A | 3/2018 |
| CN | 108305564 A | 7/2018 |
| JP | 2008058760 A | 3/2008 |

\* cited by examiner

DISPLAY DEVICE

CROSS REFERENCE TO RELATED APPLICATION

This application claims the priority of International Application No. PCT/CN2019/075427, filed on Feb. 19, 2019, which claims priority to Chinese Application No. 201811285330.4, filed on Oct. 31, 2018. The entire disclosures of each of the above applications are incorporated herein by reference.

FIELD OF INVENTION

The present invention relates to the field of display technologies, and in particular, to a display device.

DESCRIPTION OF PRIOR ART

As a type of current light emitting devices, organic light emitting diodes (OLEDs) are widely used because of its advantages such as self-illumination, rich color, fast response times, wide viewing angles, light weight, and so on.

As display products continue to upgrade, display panels with narrow frames become a trend. The display panels with narrow frames require the width of non-display regions at an edge of the display panels being minimized, especially the width of the bottom frames. At present, a control chip of a display panel is usually mounted on a flexible circuit board, which means a flat cable between a screen and a mainboard. On this basis, the flexible circuit board is bent to the back of the screen to achieve a narrow frame.

Technical Problem

Since the flexible circuit board is bent to the back of the screen, there is certain stress concentration in a bending region, especially in a peripheral area of the bending region. The stress concentration may cause the bending region to break, which will reduce the yield of the product.

SUMMARY OF INVENTION

In a first aspect, the present application provides a display device comprising a display panel, the display panel comprising a display region and a binding region disposed outside the display region;

a flexible circuit board comprising a main body portion and a connecting portion disposed on one side of the main body portion, the connecting portion being disposed on the binding region;

wherein, the connecting portion comprises a first end, and at least one second end connected to the first end and extending in a direction from the first end to the display region;

a shape of the second ends is rectangular, circular, triangular or trapezoidal;

the first end and the second end are integrally formed.

In the display device provided by the present application, the display device further comprises a driving chip, and the driving chip is disposed on the binding region; wherein, the first end and the second end are both disposed on a periphery of the driving chip.

In the display device provided by the present application, the binding region comprises a first sub-region, a bending sub-region and a second sub-region that are connected to each other;

wherein, the first sub-region is connected to the display region, the bending sub-region is disposed between the first sub-region and the second sub-region, and the driving chip and the first end are both disposed on the second sub-region.

In the display device provided by the present application, the second ends are disposed on the second sub-region.

In the display device provided by the present application, the second ends comprise a first segment, a bending segment and a second segment that are connected to each other, the first segment is disposed on the first sub-region, the bending segment is disposed on the bending sub-region, and the second segment is disposed on the second sub-region.

In the display device provided by the present application, the at least one second end comprises a first sub-end and a second sub-end disposed opposite to the first sub-end; wherein, the first sub-end is disposed on one side of the driving chip, and the second sub-end is disposed on the other side of the driving chip.

In the display device provided by the present application, the shape and size of the first sub-end and the second sub-end are identical.

In the display device provided by the present application, the number of the second ends is one, and the second end is disposed on either side of the driving chip.

In the display device provided by the present application, the number of the second ends is four, and two of the second ends are disposed on one side of the driving chip, and others of the second ends are disposed on the other side of the driving chip.

In a first aspect, the present application provides a display device comprising:

a display panel, the display panel comprising a display region and a binding region disposed outside the display region;

a flexible circuit board comprising a main body portion and a connecting portion disposed on one side of the main body portion, the connecting portion being disposed on the binding region;

wherein, the connecting portion comprises a first end, and at least one second end connected to the first end and extending in a direction from the first end to the display region.

In the display device provided by the present application, the display device further comprises a driving chip, and the driving chip is disposed on the binding region; wherein, the first end and the second end are both disposed on a periphery of the driving chip.

In the display device provided by the present application, the binding region comprises a first sub-region, a bending sub-region and a second sub-region that are connected to each other;

wherein, the first sub-region is connected to the display region, the bending sub-region is disposed between the first sub-region and the second sub-region, and the driving chip and the first end are both disposed on the second sub-region.

In the display device provided by the present application, the second ends are disposed on the second sub-region.

In the display device provided by the present application, the second ends comprise a first segment, a bending segment and a second segment that are connected to each other, the first segment is disposed on the first sub-region, the bending segment is disposed on the bending sub-region, and the second segment is disposed on the second sub-region.

In the display device provided by the present application, the at least one second end comprises a first sub-end and a second sub-end disposed opposite to the first sub-end;

wherein, the first sub-end is disposed on one side of the driving chip, and the second sub-end is disposed on the other side of the driving chip.

In the display device provided by the present application, the shape and size of the first sub-end and the second sub-end are identical.

In the display device provided by the present application, the number of the second ends is one, and the second end is disposed on either side of the driving chip.

In the display device provided by the present application, the number of the second ends is four, and two of the second ends are disposed on one side of the driving chip, and others of the second ends are disposed on the other side of the driving chip.

In the display device provided by the present application, the first end and the second end are integrally formed.

Beneficial Effect

The beneficial effect of the present application is that by providing at least one second end on the connecting portion of the flexible circuit board, the at least one second end can disperse a part of the stress when the flexible circuit board is bent, thereby avoid cracking in the bent region. By this way, the product yield is improved.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
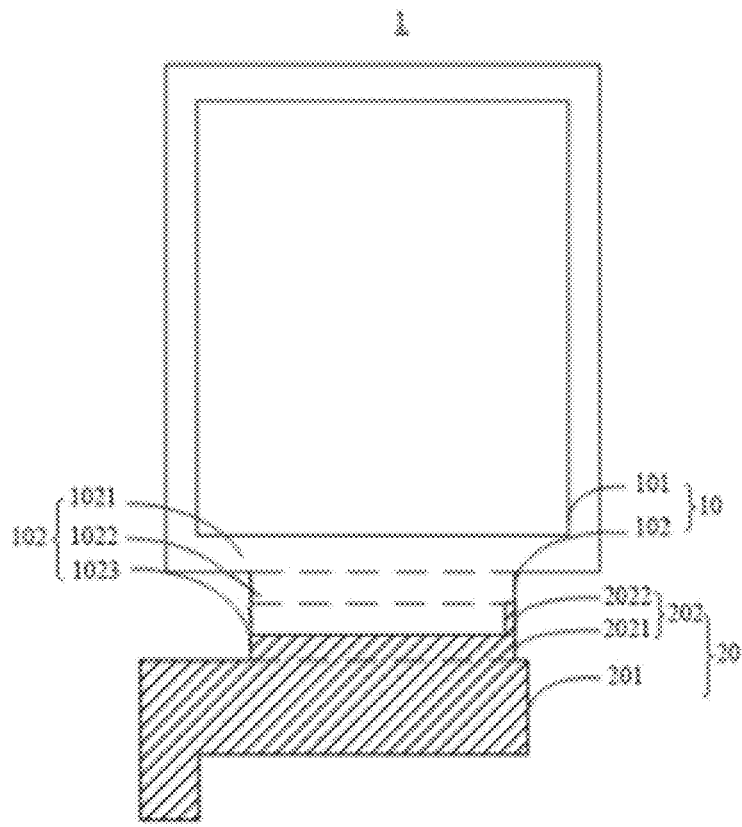
FIG. 1 is a structural diagram of a display device provided by a first embodiment of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

Figure 2:
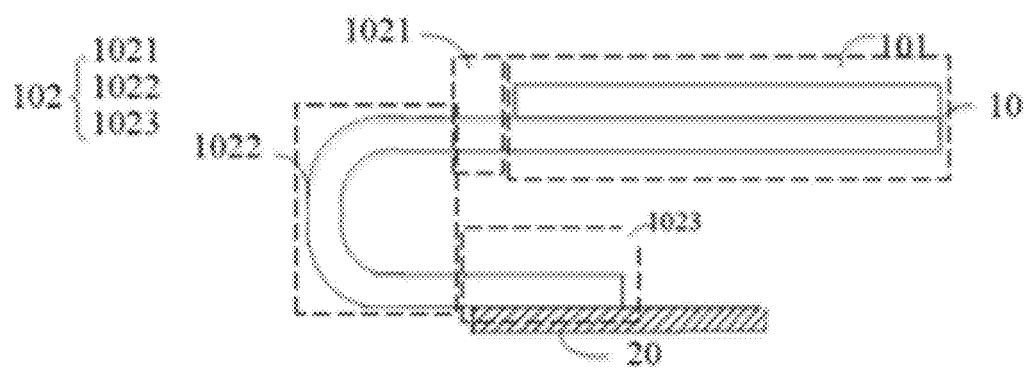
FIG. 2 is a structural diagram of the display device of FIG. 1 in a bent state.

Referring to FIG. 1 and FIG. 2, FIG. 1 is a structural diagram of a display device provided by a first embodiment of the present application, FIG. 2 is a structural diagram of the display device of FIG. 1 in a bent state.

The present application provides a display device 1, comprising:

a display panel 10, the display panel 10 comprising a display region 101 and a binding region 102 disposed outside the display region 101;

a flexible circuit board 20 comprising a main body portion 201 and a connecting portion 202 disposed on one side of the main body portion 201, the connecting portion 202 being disposed on the binding region 102;

wherein, the connecting portion 202 comprises a first end 2021, and at least one second end 2022 connected to the first end 2021 and extending in a direction from the first end 2021 to the display region 101.

The display panel 10 is a liquid crystal display panel or a flexible organic light emitting diode (OLED) display panel. Taking a flexible OLED display panel as an example, optical devices are formed on the display panel 10, and the optical devices include a stacked anode, an organic light emitting layer, and a cathode. The display panel 10 includes a display region 101 and a binding region 102. The display region 101 is used for displaying pictures. Metal flat cables are disposed on the binding region 102. Drive lines, data lines, and power lines on the display region 101 are connected to the flexible circuit board 20 disposed on the bonding area 102 through the metal flat cables. The flexible circuit board 20 includes a main body portion 201, and a connecting portion 202 disposed on one side of the main body portion 201, and the connecting portion 202 is disposed on the binding region 102. Wherein, the connecting portion 202 comprises a first end 2021, and at least one second end 2022 connected to the first end 2021 and extending in a direction from the first end 2021 to the display region 101. A size of the second ends 2022 is specifically set according to the size of the display panel 10. A shape of the second ends is rectangular, circular, triangular or trapezoidal.

And, the first end 2021 and the at least one second end 2022 are integrally formed.

In the present embodiment, by providing at least one second end 2022 on the connecting portion 202 of the flexible circuit board 20, the at least one second end 2022 can disperse a part of stress when the flexible circuit board 20 is bent, thereby avoid cracking in a bent region. By this way, the product yield is improved.

Figure 3:
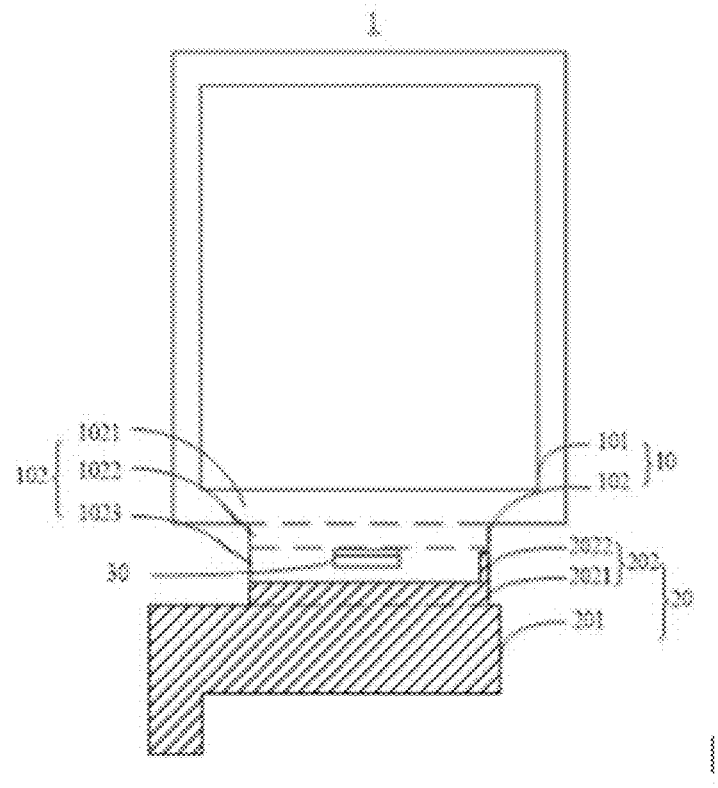
FIG. 3 is a structural diagram of a display device provided by a second embodiment of the present application.
Figure 4:
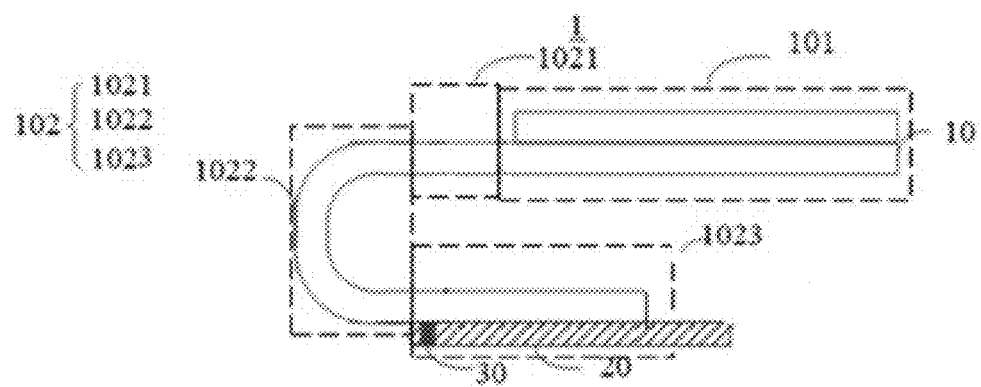
FIG. 4 is a structural diagram of the display device of FIG. 3 in a bent state.

Referring to FIG. 3 and FIG. 4, FIG. 3 is a structural diagram of a display device provided by a second embodiment of the present application, FIG. 4 is a structural diagram of the display device of FIG. 3 in a bent state.

The display device further comprises a driving chip 30, and the driving chip 30 is disposed on the binding region 102; wherein, the first end 2021 and the second end 2022 are both disposed on a periphery of the driving chip.

The number of the second ends 2022 can be set according to practice. For example, the number of second ends 2022 is one, and the second end 2022 is disposed on either side of the driving chip 30, as shown in FIG. 3. When the display panel 10 is bent, the second end 2022 provided on one side of the driving chip 30 disperses a portion of bent stress so that the bending region does not break or crack due to bending. Therefore, the product yield is improved. Also, since the second end 2022 is provided on the connecting portion 202, a contacting area of the flexible circuit board 20 with the binding region 102 is increased. When bending, the flexible circuit board 20 is not easily peeled off. Therefore, the product yield is further improved.

Figure 5:
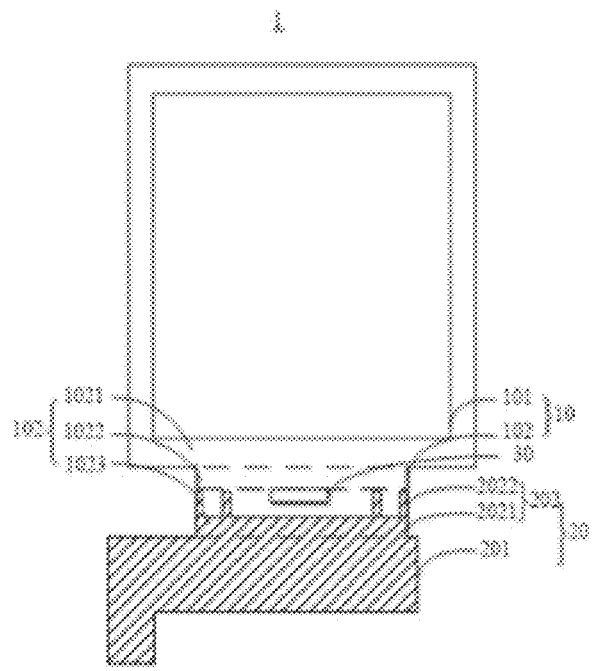
FIG. 5 is a structural diagram of a display device provided by a third embodiment of the present application.

For another example, the number of the second ends 2022 is four, and two second ends 2022 are disposed on one side of the driving chip 30, and the other two second ends 2022 are disposed on the other side of the driving chip 30, as shown in FIG. 5. When the display panel 10 is bent, the two second ends 2022 disposed on one side of the driving chip 30 and the two second ends 2022 disposed on the other side of the driving chip 30 are partially bent to disperse the stress in the bending region, so that the bending region will not break or creak due to bending. Therefore, the product yield is improved. Also, since four second end portions 2022 are disposed on the connecting portion 202, the contacting area of the flexible circuit board 20 with the binding region 102 is increased. When bent, the flexible circuit board 20 is not easily peeled off. Therefore, the product yield is further improved.

Figure 6:
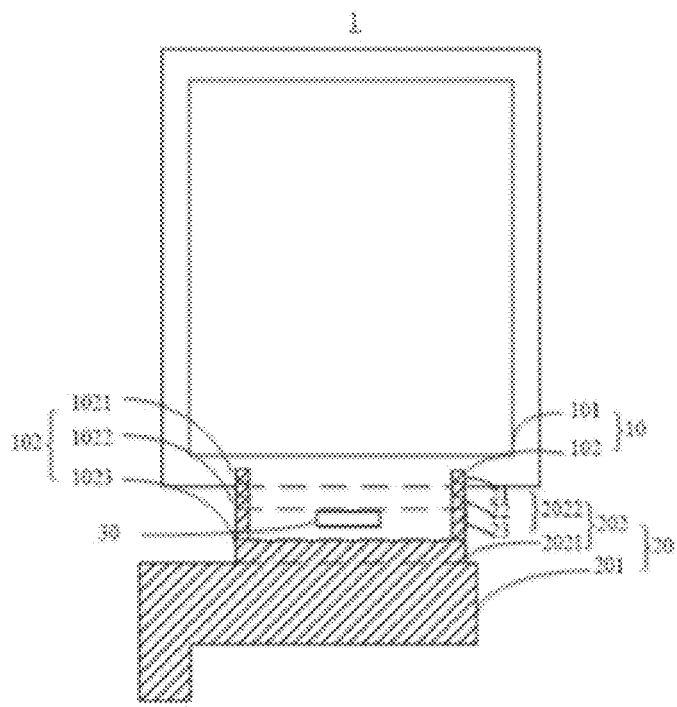
FIG. 6 is a structural diagram of a display device provided by a fourth embodiment of the present application.
Figure 7:
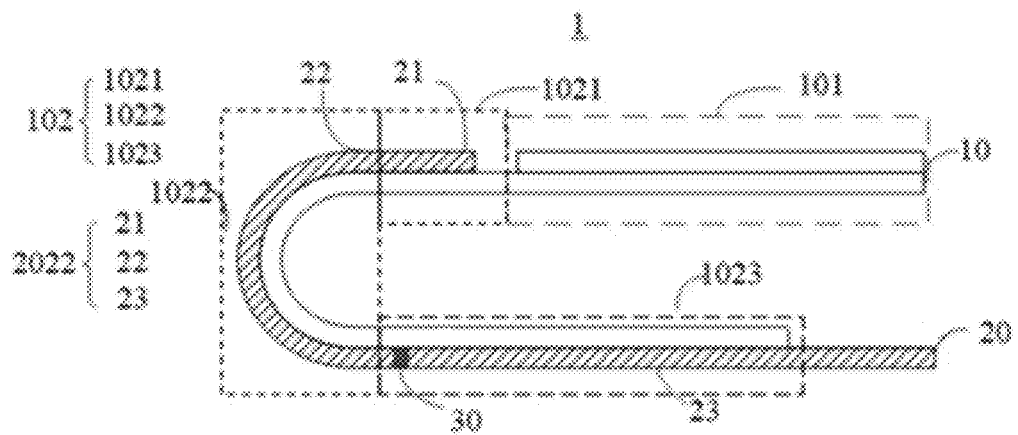
FIG. 7 is a structural diagram of the display device of FIG. 6 in a bent state.

Referring to FIG. 6 and FIG. 7, FIG. 6 is a structural diagram of a display device provided by a fourth embodiment of the present application, FIG. 7 is a structural diagram of the display device of FIG. 6 in a bent state.

A binding region 102 comprises a first sub-region 1021, a bending sub-region 1022, and a second sub-region 1023 that are connected to each other.

Wherein, the first sub-region 1021 is connected to the display region 101, the bending sub-region 1022 is disposed between the first sub-region 1021 and the second sub-region 1023, and the driving chip 30 and the first end 2021 are both disposed on the second sub-region 1023.

In this embodiment, the first sub-region 1021 is a horizontal region connected to the display region 101. The bending sub-region 1022 is disposed between the first sub-region 1021 and the second sub-region 1023, and the bending sub-region 1022 is used for bending. The chip 30 and the first end 2021 are disposed on the second sub-region 1023. Moreover, in a specific implementation, the second sub-region 1023 is folded over to the back of the display panel 10 to achieve a narrow frame, as shown in FIG. 6. Furthermore, the second ends 2022 are all disposed on the second sub-region 1023. For example, the connecting portion 202 includes five second ends 2022, and the five second ends 2022 are disposed on the second sub-region 1023. For another example, the connecting portion 202 has only one second end 2022, and the second end 2022 is disposed on the second sub-region 1023. Of course, the number of the second ends 2022 could also be three, and the number of the second ends 2022 is merely examples of the present application, which is not intended to limit the application.

In the present embodiment, by providing the second end portion 2022 on the connecting portion 202, when the display panel is bent, the bending region will not break. That is, the present invention does not cause the bent sub-region 1022 to break, thereby avoid causing the display panel to fail. Therefore, the product yield is improved.

The second ends comprise a first segment 21, a bending segment 22, and a second segment 23 that are connected to each other, the first segment 21 is disposed on the first sub-region 1021, the bending segment 22 is disposed on the bending sub-region 1022, and the second segment 23 is disposed on the second sub-region 1023.

In the present embodiment, the second ends comprise a first segment 21, a bending segment 22, and a second segment 23 that are connected to each other, the first segment 21 is disposed on the first sub-region 1021, the bending segment 22 is disposed on the bending sub-region 1022, and the second segment 23 is disposed on the second sub-region 1023. When the display panel is bent, the first segment 21, the bending segment 22, and the second segment 23 will disperse the stress of the bending region, so that the bending region will not break. That is, the present invention does not cause the bent sub-region 1022 to break, thereby avoid causing the display panel to fail. Therefore, the product yield is improved. Furthermore, the first segment 21 is disposed on the first sub-region 1021, the bending segment 22 is disposed on the bending sub-region 1022, and the second segment 23 is disposed on the second sub-region 1023, thereby the contacting area of the flexible circuit board 20 with the bonding region 102 is increased, so that there is less risk of the flexible circuit board 20 falling off during bending, thereby improving product yield.

Figure 8:
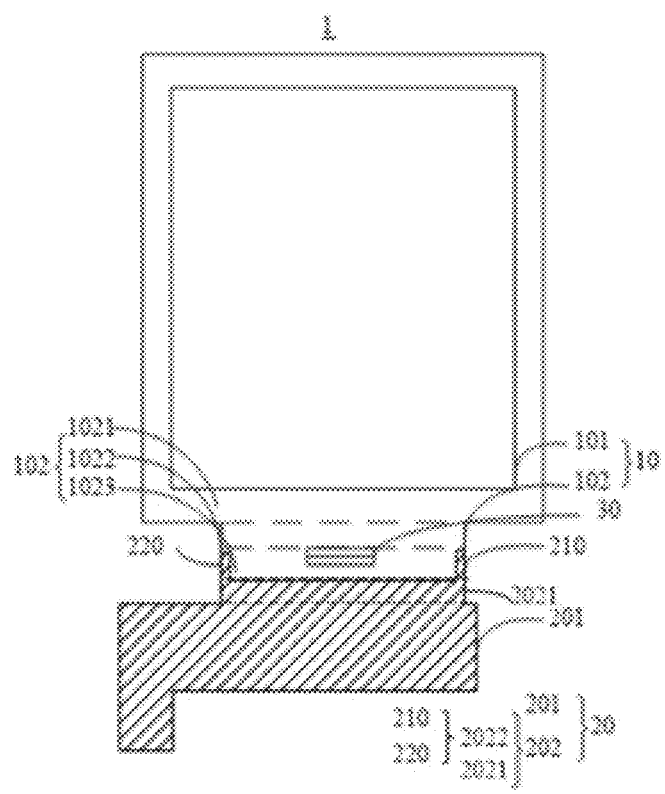
FIG. 8 is a structural diagram of a display device provided by a fifth embodiment of the present application.

As shown in FIG. 8, FIG. 8 is a structural diagram of a display device provided by a fifth embodiment of the present application.

Each of the second ends 2022 comprises a first sub-end 210 and a second sub-end 220 disposed opposite to the first sub-end 210; wherein, the first sub-end 210 is disposed on one side of the driving chip 30, and the second sub-end 220 is disposed on the other side of the driving chip 30. The shape and size of the first sub-end 210 and the second sub-end 220 are identical.

For example, when the display panel 10 is bent, the first sub-end 210 and the second sub-end 220 on the second end 2022 can absorb a part of the stress when bending, therefore the risk of breakage of the bent sub-region 1022 of the display panel 10 is reduced. Moreover, the bonding performance of the flexible circuit board 20 and the binding region 102 can also be improved, and the product yield is further improved.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display device, comprising:
   a display panel, the display panel comprising a display region and a binding region disposed outside the display region;
   a flexible circuit board comprising a main body portion and a connecting portion disposed on one side of the main body portion, the connecting portion disposed on the binding region;
   wherein the connecting portion comprises a first end, and at least one second end connected to the first end and extending in a direction from the first end to the display region;
   a shape of the at least one second end is rectangular, circular, triangular, or trapezoidal;
   the first end and the at least one second end are integrally formed; and
   the binding region comprises a first sub-region, a bending sub-region, and a second sub-region that are connected to each other, the first sub-region is connected to the display region, the bending sub-region is disposed between the first sub-region and the second sub-region, and a driving chip, the first end, and the at least one second end are disposed on the second sub-region.

2. The display device according to claim 1, wherein the first end and the at least one second end are both disposed surrounding the driving chip.

3. The display device according to claim 2, wherein the at least one second end comprises a first segment, a bending segment, and a second segment that are connected to each other, the first segment is disposed on the first sub-region, the bending segment is disposed on the bending sub-region, and the second segment is disposed on the second sub-region.

4. The display device according to claim 2, wherein the at least one second end comprises a first sub-end and a second sub-end disposed opposite to the first sub-end; wherein, the first sub-end is disposed on one side of the driving chip, and the second sub-end is disposed on the other side of the driving chip.

5. The display device according to claim 4, wherein a shape and size of the first sub-end and the second sub-end are identical.

6. The display device according to claim 2, wherein a number of the at least one second end is one, and the second end is disposed on either side of the driving chip.

7. The display device according to claim 2, wherein a number of the at least one second end is four, and two of the second ends are disposed on one side of the driving chip, and others of the second ends are disposed on the other side of the driving chip.

8. A display device, comprising:
a display panel, the display panel comprising a display region and a binding region disposed outside the display region;
a flexible circuit board comprising a main body portion and a connecting portion disposed on one side of the main body portion, the connecting portion being disposed on the binding region;
wherein, the connecting portion comprises a first end, and at least one second end connected to the first end and extending in a direction from the first end to the display region; and
the binding region comprises a first sub-region, a bending sub-region, and a second sub-region that are connected to each other, the first sub-region is connected to the display region, the bending sub-region is disposed between the first sub-region and the second sub-region, and a driving chip, the first end, and the at least one second end are disposed on the second sub-region.

9. The display device according to claim 8, wherein the first end and the at least one second end are both disposed surrounding the driving chip.

10. The display device according to claim 9, wherein the at least one second end comprise a first segment, a bending segment, and a second segment that are connected to each other, the first segment is disposed on the first sub-region, the bending segment is disposed on the bending sub-region, and the second segment is disposed on the second sub-region.

11. The display device according to claim 9, wherein the at least one second end comprises a first sub-end and a second sub-end disposed opposite to the first sub-end; wherein, the first sub-end is disposed on one side of the driving chip, and the second sub-end is disposed on the other side of the driving chip.

12. The display device according to claim 11, wherein a shape and size of the first sub-end and the second sub-end are identical.

13. The display device according to claim 9, wherein a number of the at least one second end is one, and the second end is disposed on either side of the driving chip.

14. The display device according to claim 9, wherein a number of the at least one second end is four, and two of the second ends are disposed on one side of the driving chip, and others of the second ends are disposed on the other side of the driving chip.

15. The display device according to claim 8, wherein the first end and the at least one second end are integrally formed.

* * * * *